US 7,414,295 B2

(12) United States Patent
Cho et al.

(10) Patent No.: US 7,414,295 B2
(45) Date of Patent: Aug. 19, 2008

(54) TRANSISTOR AND METHOD OF OPERATING TRANSISTOR

(75) Inventors: Choong-Rae Cho, Gimhae-si (KR);
In-Kyeong Yoo, Suwon-si (KR);
Myoung-Jae Lee, Suwon-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 377 days.

(21) Appl. No.: 11/274,475

(22) Filed: Nov. 16, 2005

(65) Prior Publication Data
US 2006/0108639 A1    May 25, 2006

(30) Foreign Application Priority Data
Nov. 16, 2004    (KR)    .................... 10-2004-0093639

(51) Int. Cl.
*H01L 29/8605*    (2006.01)
*G11C 11/00*    (2006.01)
(52) U.S. Cl. ................ 257/529; 257/537; 257/547; 257/E29.326; 365/148
(58) Field of Classification Search ........... 257/E29.326
See application file for complete search history.

(56) References Cited

U.S. PATENT DOCUMENTS 5,070,383 A * 12/1991 Sinar et al. ................ 257/537
2004/0202041 A1 * 10/2004 Hidenori .................... 365/233
2006/0034116 A1 * 2/2006 Lam et al. .................. 365/151
2006/0250837 A1 * 11/2006 Herner et al. ............... 365/148
2007/0096248 A1 * 5/2007 Philipp et al. .............. 257/528

FOREIGN PATENT DOCUMENTS

JP    2003-174087    6/2003

OTHER PUBLICATIONS

English Translation of Notice to Submit Response issued for corresponding Korean Application No. 10-2004-0093639, dated Mar. 22, 2006.

* cited by examiner

*Primary Examiner*—Stephen W Smoot
(74) *Attorney, Agent, or Firm*—Harness, Dickey & Pierce, P.L.C.

(57)    ABSTRACT

A transistor in which a physical property of its channel is changed according to an applied voltage, and methods of manufacturing and operating the same are provided. The transistor may include a first conductive layer on a substrate, a phase change layer and a second conductive layer which are sequentially stacked on the first conductive layer, a first current direction limiting unit and a second current direction limiting unit formed on the second conductive layer by being separated within a space, a third conductive layer and a fourth conductive layer formed on the first current direction limiting unit and the second current direction limiting unit, respectively, a word line connected to the third conductive layer, a bit line connected to the fourth conductive layer, and a voltage lowering unit connected to the word line.

14 Claims, 5 Drawing Sheets

TRANSISTOR AND METHOD OF OPERATING TRANSISTOR

PRIORITY STATEMENT

This application claims the benefit of Korean Patent application No. 10-2004-0093639, filed on Nov. 16, 2004, in the Korean Intellectual Property Office, the disclosure of which is incorporated herein in its entirety by reference.

BACKGROUND OF THE INVENTION

1. Field of the Invention

Example embodiments of the present invention relate to a semiconductor device and a method of manufacturing the same, and more particularly, to a transistor, a method of manufacturing a transistor, and method of operating a transistor.

2. Description of the Related Art

Transistors used in a semiconductor device may be field effect transistors (FET). An FET may maintain a signal transmission path as an ON-state or an OFF-state according to an applied voltage in a semiconductor device.

FIG. 1 illustrates a conventional field effect transistor (FET).

Referring to FIG. 1, a semiconductor substrate 10 may include a source region 12 and a drain region 14. The source region 12 may be separated from the drain region 14 by a given space. A gate stack structure 16 may be arranged between the source region 12 and the drain region 14 on the semiconductor substrate 10. The gate stack structure 16 may include a gate oxide layer and a gate electrode, which may be sequentially stacked. A channel 18 may be arranged under the gate stack structure 16. An inter-layer insulating layer 20 may be formed on the semiconductor substrate 10 to cover the gate stack structure 16. A contact hole (h) may be formed in the inter-layer insulating layer 20 to expose the source region 12. A bit line 22 filling the contact hole (h) may be formed on the inter-layer insulating layer 20.

A conventional FET as described above may generate large quantity of heat because the conventional FET is operated by a comparative high operating voltage. Accordingly, it may be difficult to supply high current.

SUMMARY OF THE INVENTION

Example embodiments of the present invention provide a transistor generating less heat and/or providing higher current.

Example embodiments of the present invention also provide a method of manufacturing a transistor.

Example embodiments of the present invention also provide a method of operating a transistor.

According to an example embodiment of the present invention, there is provided a transistor including a substrate, a first conductive layer on the substrate, a phase change layer and a second conductive layer sequentially stacked on the first conductive layer, first and second current direction limiting units formed on the second conductive layer, wherein the first and second current direction limiting units are separated; a third conductive layer and a fourth conductive layer formed on the first current direction limiting unit and the second current direction limiting unit, respectively; a word line connected to the third conductive layer; a bit line connected to the fourth conductive layer; and a voltage lowering unit connected to the word line.

In an example embodiment, the phase change layer may be a material layer of which conductivity is varied according to an applied voltage and the material layer may be one of a vanadium oxide layer, a nickel oxide layer and a hafnium oxide layer.

In an example embodiment the first and second current direction limiting units may include a first PN conjunction layer and a second PN conjunction layer, respectively, preventing a current from backflowing from the phase change layer to the word line and the bit line, respectively, and each of the first and second conjunction layers may include an N-type material layer and a P-type material layer, which are sequentially stacked. The N-type material layer may be one of a nickel oxide layer and a titanium oxide layer and the P-type material layer may be a nickel oxide layer.

In an example embodiment, the voltage lowering unit may include a resistor connected to one end of the word line.

In an example embodiment, the phase change layer may cover a region of the first conductive layer.

According to another example embodiment of the present invention, there is provided a method of manufacturing a transistor including forming a first conductive layer on a substrate, forming a phase change layer on the first conductive layer, forming a second conductive layer on the phase change layer as a common electrode, forming a first current direction limiting unit and a second current direction limiting unit on the second conductive layer with a space therebetween, and forming a third conductive layer and a fourth conductive layer on the first current direction limiting unit and the second current direction limiting unit, forming a bit line to be connected one of the third conductive layer and the fourth conductive layer, forming a word line to be connected one of the third conductive layer and the fourth conductive layer which is not connected to the bit line, and forming a voltage lowering unit at one end of the word line.

In an example embodiment, the phase change layer may be formed with a material layer of which conductivity is varied according to an applied voltage and the material layer may be one of a vanadium oxide layer, a nickel oxide layer and a hafnium oxide layer.

In an example embodiment, forming the first current direction limiting unit and the second current direction limiting unit may further include sequentially stacking a N-type material layer, a P-type material layer and a conductive layer on the second conductive layer, forming a mask limiting two separated regions on the conductive layer, sequentially etching the conductive layer, the P-type material layer and the N-type material layer around the mask; and removing the mask.

In an example embodiment, the N-type material layer may be one of a nickel oxide layer and a titanium oxide layer and the P-type material layer may be a nickel oxide layer.

In an example embodiment, forming a bit line may include forming an inter-layer insulating layer covering the third conductive layer and the fourth conductive layer on the substrate, forming a via hole exposing one of the third conductive layer and the fourth conductive layer on the inter-layer insulating layer, forming a conductive layer filling the via hole on the inter-layer insulating layer, and patterning the conductive layer filing the via hole as a line shape parallel to the first conductive layer.

In an example embodiment, the forming the word line may further include: forming an inter-layer insulating layer covering the bit line, forming a via hole exposing one of the third conductive layer and the fourth conductive layer which is not connected to the bit line on the inter-layer insulating layer, forming a conductive layer filling the via hole on the inter-layer insulating layer, and patterning the conductive layer filling the via hole to be a line shape crossing the bit line.

In an example embodiment, the voltage lowering unit may include a resistor.

According to another example embodiment of the present invention, there is provided a method of operating a transistor including a first conductive layer prepared as a line shape on a substrate, a phase change layer and a second conductive layer which are sequentially stacked on the first conductive layer, a first current direction limiting unit and a second current direction limiting unit formed on the second conductive layer and separated within a desired space, a third conductive layer and a fourth conductive layer formed on the first current direction limiting unit and the second current direction limiting unit, respectively, a word line connected to the third conductive layer, a bit line connected to the fourth conductive layer, and a voltage lowering unit connected to the word line, the method including maintaining an electric potential difference between the bit line and the first conductive layer and applying an operating voltage to the word line.

In an example embodiment, the operating voltage may be lower than the electric potential difference.

According to example embodiments of present invention, a transistor may generate less heat and/or provide higher current.

BRIEF DESCRIPTION OF THE DRAWINGS

The present invention will become more apparent by describing in detail exemplary embodiments thereof with reference to the attached drawings in which.

DETAILED DESCRIPTION OF EXAMPLE EMBODIMENTS OF THE INVENTION

Figure 1:
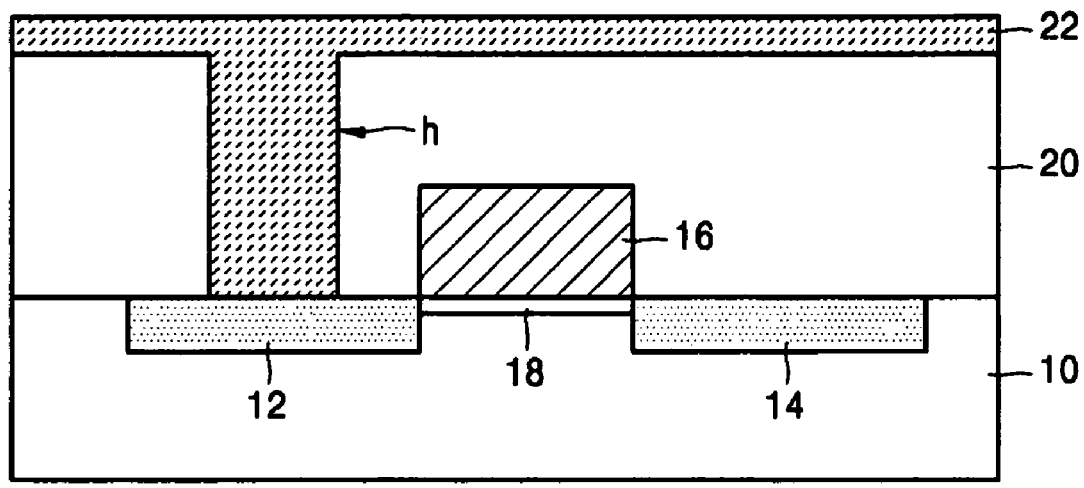
FIG. 1 is a cross sectional view of a conventional transistor.

A transistor and a method of manufacturing and operating the same according to the present invention will now be described more fully with reference to the accompanying drawings, in which example embodiments of the invention are shown. In the drawings, the thicknesses of layers and regions are exaggerated for clarity.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Figure 2:
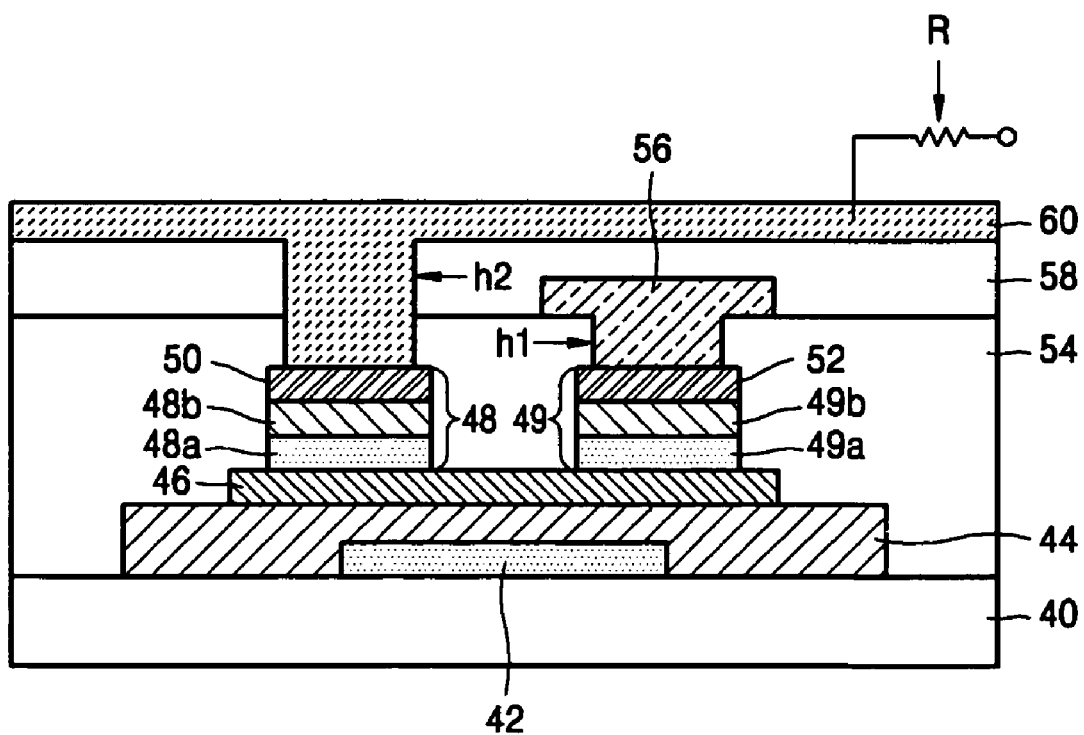
FIG. 2 is a cross sectional view of a transistor according to an example embodiment of the present invention, where a physical property of a channel of the transistor is changed according to an applied voltage.

FIG. 2 is a cross sectional view of a transistor according to an example embodiment of the present invention, where a physical property of a channel of the transistor is changed by an applied voltage.

Referring to FIG. 2, a first conductive layer 42 may be formed on a region of a substrate 40. The substrate 40 may be a substrate suitable for a low temperature process. For example, the substrate 40 may be a glass substrate. The first conductive layer 42 may be formed to be linear in a direction perpendicular to the paper. A phase change layer 44 covering a region of the first conductive layer 42 may be arranged on the substrate 40. A physical property of the phase change layer 44 may change from an insulating property to a conductive property or vice versa according to an externally applied voltage. The phase change layer 44 may be a vanadium oxide layer (for example, $V_2O_5$), nickel oxide layer (for example, NiO, $Ni_2O_5$) or a hafnium oxide layer (for example, $HfO_2$). A second conductive layer 46 may be formed on a region of the phase change layer 44. The second conductive layer 46 may be used as a common electrode. A first PN conjunction layer 48 and a second PN conjunction 49 may be formed on two separated regions of the second conductive layer 46. That is, separated PN diode layers may be formed on the second conductive layer 46.

The first PN conjunction layer may include a sequentially stacked N-type material layer 48a and a P-type material layer 48b. The second PN conjunction layer 49 may also include a sequentially stacked N-type material layer 49a and a P-type material layer 49b. The N-type material layers 48a and 49a may be a nickel oxide layer (NiO) or a titanium oxide layer (TiO$_2$). The P-type material layers 48b and 49b may be a nickel oxide layer. The first PN conjunction layer 48 may prevent a current applied to the second conductive layer 46 through a bit line 56 from backflowing to a word line 60. The second PN conjunction layer 49 may prevent a current applied to the second conductive layer 46 through the word line 60 from backflowing to the bit line 56.

A third conductive layer 50 may be formed on the first PN conjunction layer 48 and a fourth conductive layer 52 may be formed on the second PN conjunction layer 49. A first inter-layer insulating layer 54 may be formed on the substrate 40 to surround the phase change layer 44, the second conductive layer 46, the first and the second PN conjunction layers 48 and 49. A first via hole h1 may be formed in the first inter-layer insulating layer 54 to expose an upper surface of the fourth conductive layer 52. A bit line 56 filling the first via hole (h1) may be formed on the first inter-layer insulating layer 54. The bit line 56 may contact the exposed surface of the fourth conductive layer 52. The bit line 56 may be linear, have a defined width, and/or be formed in parallel to the first conductive layer 42.

A second inter-layer insulating layer 58 may be formed on the first inter-layer insulating layer 54 to cover the bit line 56. A second via hole h2 may be formed in the first and the second inter-layer insulating layer 54 and 58 to expose an upper surface of the third conductive layer 50. A word line 60 filling the second via hole (h2) may be formed on the second inter-layer insulating layer 58. The word line 60 may contact the exposed surface of the third conductive layer 50. The word line 60 may be arranged above the bit line 56 and may orthogonally cross the bit line 56. A resistor R may be placed in series with the word line 60. The resistor R may maintain a voltage applied to the third conductive layer 50 to not allow current to flow to the phase change layer 44.

Figure 3:
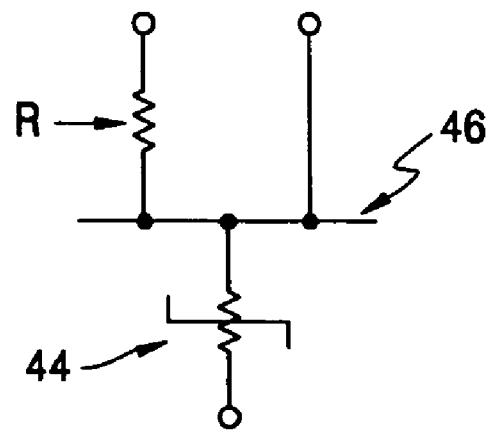
FIG. 3 is an example equivalent circuit diagram of FIG. 2.

FIG. 3 shows an example equivalent circuit of the transistor shown in FIG. 2.

Figure 4:
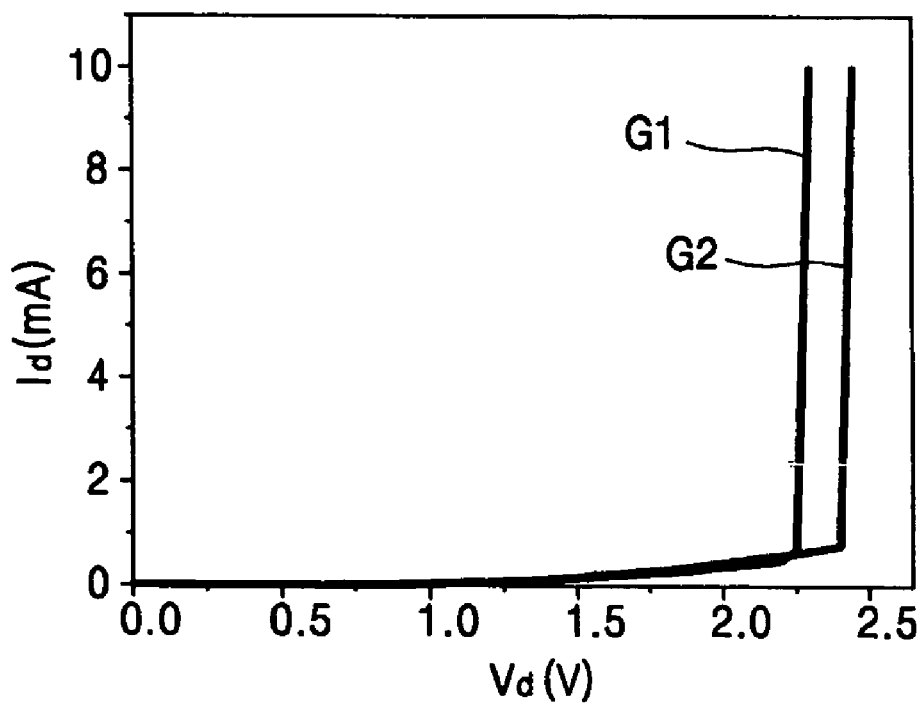
FIG. 4 is an example graph showing a characteristic of a transistor shown in FIG. 2.

FIG. 4 is a graph showing an example operating characteristic of the transistor shown in FIG. 2.

In FIG. 4, Graph G1 shows variation of a drain current (Id) according to a drain voltage (Vd) when 1V is applied to a gate. That is, the first graph (G1) shows variations of a current flowing between the first conductive layer 42 and the fourth conductive layer 52 according to a voltage applied between the first conductive layer 42 and the fourth conductive layer 52 when 1V is applied to the third conductive layer 50. Graph G2 also shows variation of a drain current (Id) flowing between the first conductive layer 42 and the fourth conductive layer 52 according to the drain voltage when 0V is applied to the third conductive layer 50.

As shown in the first and the second graphs G1 and G2, a drain voltage (Vd) where a drain current (Id) is meaningfully increased is varied according to a voltage applied to a gate. That is, the drain voltage Vd where the drain current Id is suddenly raised is varied according to a voltage supplied to the gate. In the first graph G1, the drain current Id is suddenly increased when the drain voltage Vd is 2.25V. In the second graph G2, the drain current Id is suddenly increased when the drain voltage Vd reaches 2.5V. As shown, because the drain voltage Vd, hereinafter a starting voltage, suddenly increasing the drain current Id is shifted according to a voltage applied to the third conductive layer 50 which is a gate, an ON-state or OFF-state of the transistor shown in FIG. 2 can be controlled by controlling a voltage applied to the gate. That is, if a first starting voltage is V1 when 1V is applied to the gate and a second starting voltage is V2 when 0V is applied to a gate, the transistor can be controlled to be in an ON-state or an OFF-state by controlling the voltage applied to the gate to 0V or 1V while the drain voltage Vd is maintained between the first starting voltage V1 and the second starting voltage V2.

Figure 5:
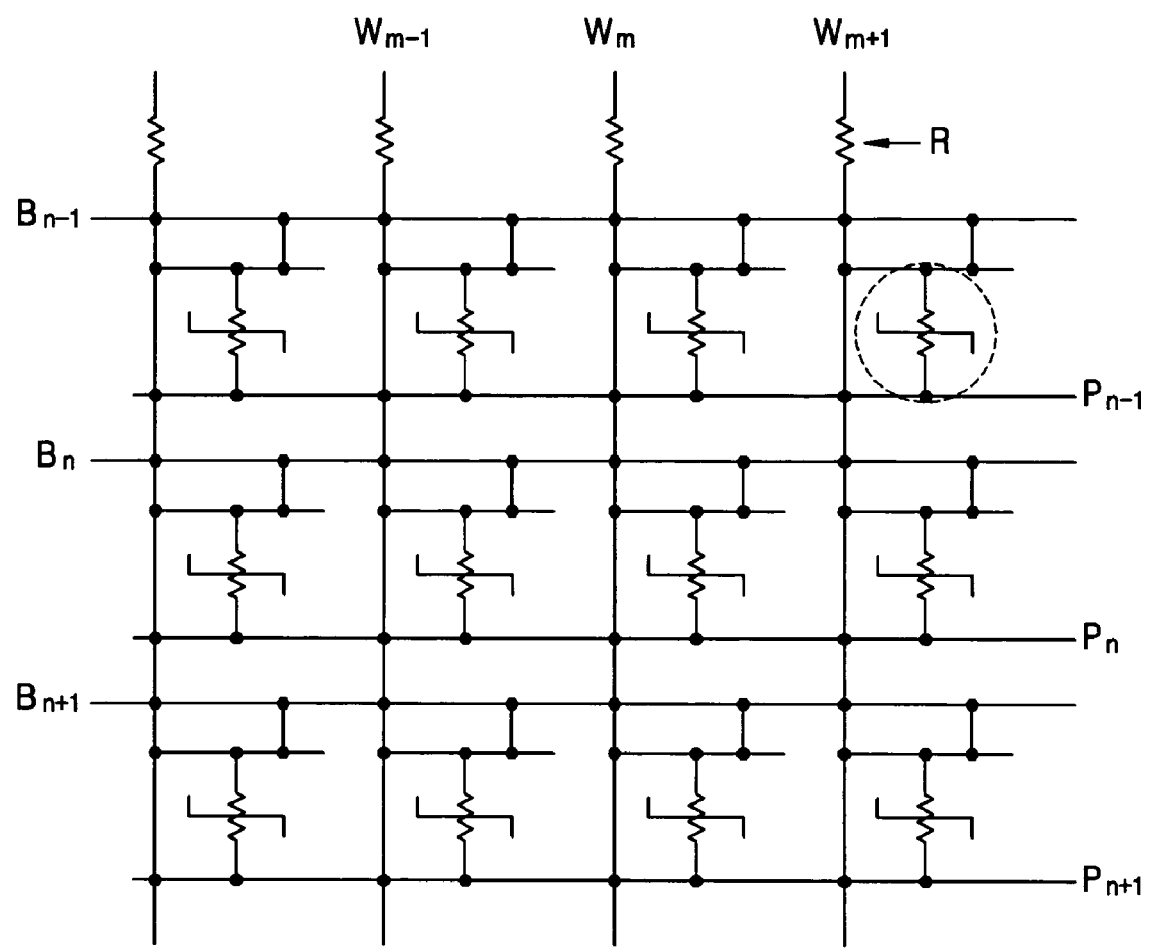
FIG. 5 is a circuit diagram illustrating an example cell array including a transistor shown in FIG. 2.

FIG. 5 is a circuit diagram showing an example cell array of transistors shown in FIG. 2.

Referring to FIG. 5, Wm−1, Wm, Wm+1 denote word lines, Bn−1, Bn, Bn+1 represent bit lines and Pn−1, Pn, Pn+1 denote plate lines corresponding to the first conductive layer 42 shown in FIG. 2. The bit lines (Bn−1, Bn, Bn+1) may be arranged in parallel with the plate lines (Pn−1, Pn, Pn+1).

Hereinafter, a method of manufacturing a transistor according to an example embodiment of the present invention will be explained in detail.

Figure 6:
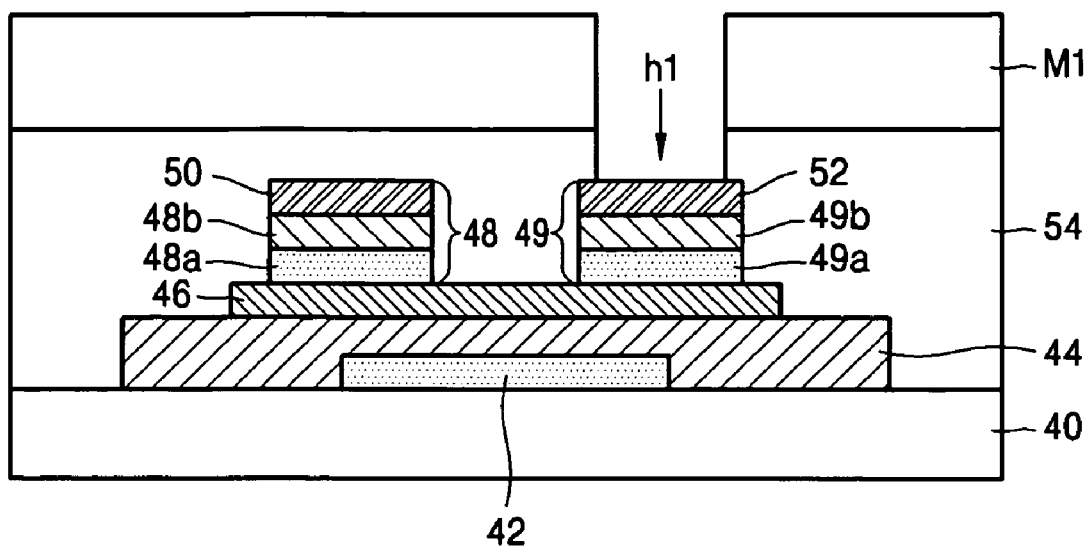
FIGS. 6 through 9 are cross sectional views of an example method of manufacturing a transistor shown in FIG. 2.

Referring to FIG. 6, a first conductive layer 42 is formed on a substrate 40. The substrate 40 may be a glass substrate or a plastic substrate. The first conductive layer 42 may be formed to be linear in shape in a direction perpendicular to the paper. After forming the first conductive layer 42, a phase change layer 44 may be formed to cover the first conductive layer 42. After forming the phase change layer 44, the phase change layer 44 may patterned to cover a desired region of the first conductive layer 42 by using, for example, a photolithography process.

A physical property of the phase change layer 44 may be changed from an insulating property to a conductive property according to an externally applied voltage. A vanadium oxide layer (for example, V$_2$O$_5$), nickel oxide layer (for example, NiO, Ni$_2$O$_5$), or a hafnium oxide layer (for example, HfO$_2$) may be used for the phase change layer 44. The phase change layer 44 may be formed by forming a metal layer made of metal included in the phase change layer 44 and oxidizing the metal layer or a metal oxide material may be directly formed on the substrate 40. After forming the phase change layer 44, a second conductive layer 46 may be formed on a region of the phase change layer 44. The second conductive layer 46 may be formed of the same conductive material used for the first conductive layer 42.

An N-type material layer (not shown), a P-type material (not shown) and a conductive layer (not shown) may be sequentially formed on a surface of the second conductive layer 46. The N-type material layer may be a nickel oxide layer (for example, NiO) or a titanium oxide layer (for example, TiO$_2$). The P-type material layer may be a nickel oxide layer, for example.

A photosensitive film pattern (not shown) may be formed on the conductive layer for limiting a region of a first and a second PN conjunction layer 48 and 49. The conductive layer, the P-type material layer and the N-type material layer may be sequentially etched using the photosensitive film pattern as an etching mask. According to an etching process, a first PN conjunction layer 48 including sequentially stacked the N-type material layer 48a and the P-type material layer 48b may be formed on an upper surface of the second conductive layer 46. Also, a second PN conjunction layer 49 including sequentially stacked N-type material layer 49a and the P-type material layer 49b may be formed on the upper surface of the second conductive layer 46, separate from the first PN conjunction layer 48. A third and a fourth conductive layer 50, 52 may be formed on the first PN conjunction layer 48 and the second PN conjunction layer 49, respectively.

A first inter-layer insulating layer 54 may be formed on the substrate 40 to surround the phase change layer 44, the second conductive layer 46, the first PN conjunction layer 48 and the second PN conjunction layer 49. After forming the first inter-layer insulating layer 54, a bit line 56 may be formed. In order to form the bit line 56, a photosensitive film M1 may be formed on the first inter-layer insulating layer 54 and the photosensitive film M1 may be patterned to expose a region of the first inter-insulating layer 54 using a photo process and/or a developing process. The exposed area of the first inter-layer insulating layer 54 may cover an upper surface of the fourth conductive layer 52. By using a photosensitive film M1 as an etching mask, the exposed area of the first inter-layer insulating layer 54 may be etched. The etching process may progress until an upper surface of the fourth conductive layer 52 is exposed. After the etching process, the photosensitive film M1 may be removed. By the above described etching process, a first via hole (h1) may be formed on the first inter-layer insulating layer 54 to expose the upper surface of the fourth conductive layer 52.

Figure 7:
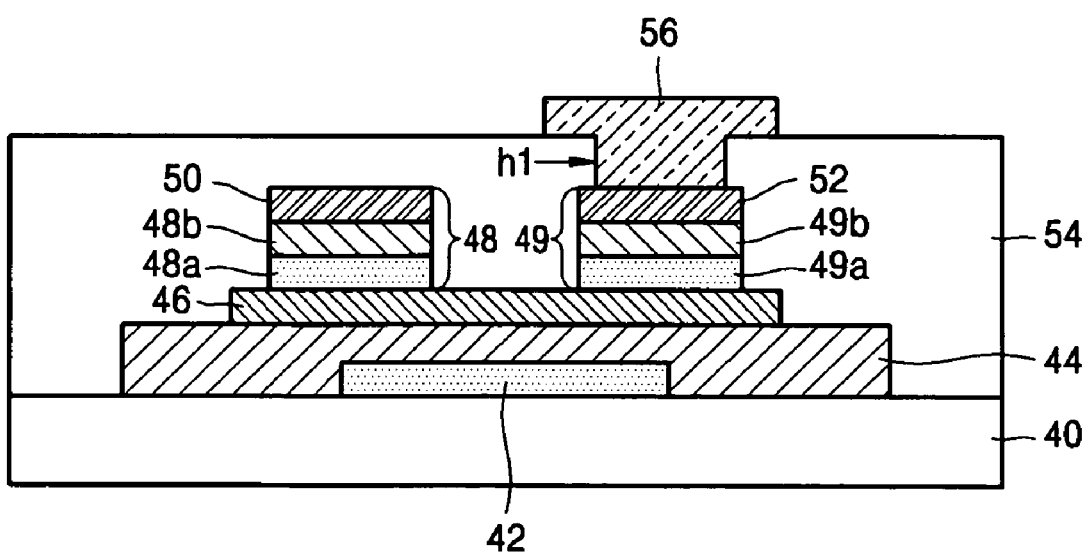

Referring to FIG. 7, the bit line 56 contacting the fourth conductive layer 52 may be formed by filling the first via hole (h1). The bit line 56 may be linear, have a width, and may be formed in a direction perpendicular to the paper. The bit line 56 may be formed in parallel to the first conductive layer 42.

Figure 8:
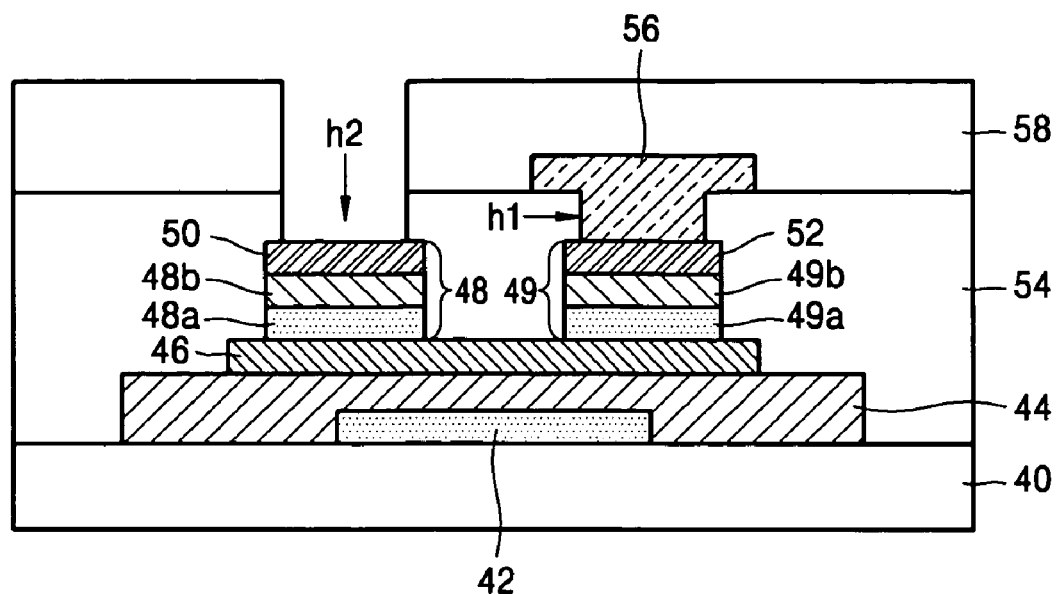

Referring to FIG. 8, a second inter-layer insulating layer 58 may be formed on the first inter-layer insulating layer 54 to cover the bit line 56. A second via hole h2 may be formed on the first and the second inter-layer insulating layer 54 and 58 to expose an upper surface of the third conductive layer 50 by etching an area of the first and the second inter-layer insulating layer 54 and 58 using, for example, the method of forming the first via hole.

Figure 9:
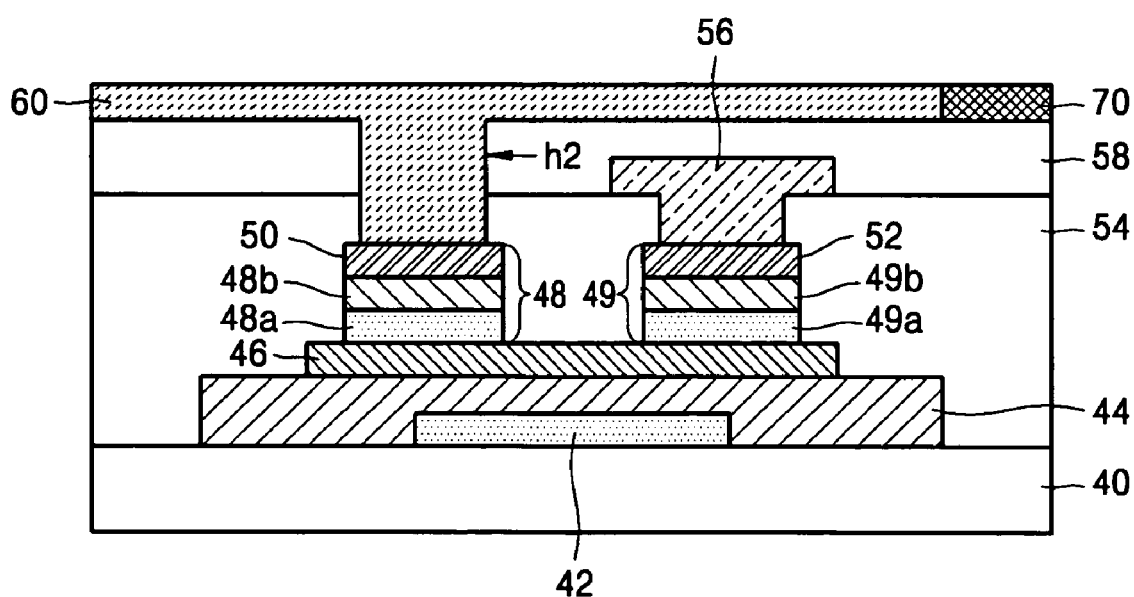

Referring to FIG. 9, a word line 60 may be formed on the second inter-layer insulating layer 58. The word line 60 may be formed by filling the second via hole h2 contacting the upper surface of the third conductive layer 50. Also, the word line 60 may orthogonally cross the bit line 56. Between the word line 60 and a power source (not shown), a resistor layer 70 connected to both sides may be formed. The resistor layer 70 may be the resistor R of FIG. 2. The resistor layer 70 may have a resistance lowering a voltage applied to the phase change layer 44 to not allow current flow to the phase change layer 44 through the word line 60.

Hereinafter, a method of operating a transistor according to an example embodiment of the present invention will be explained in detail.

Referring to FIG. 9, the phase change layer 44 may be turned on or off by applying an operating voltage to the third conductive layer 50, which is a gate, while maintaining an electric potential difference between the first conductive layer 42 and the bit line 56. Referring to FIG. 4, if 1V is applied to the third conductive layer 50 as the operating voltage while maintaining the electric potential difference between the first and the fourth conductive layer 42 and 52 as a voltage between a first starting voltage V1 and the second starting voltage V2, the phase change layer 44 may turn on. Accordingly, a transistor according to an example embodiment of the present embodiment may turn on. In order to turn off the phase change layer 44, the operating voltage applied to the third conductive layer 50 may decrease to about 0V while maintaining the electric potential difference between the first and the fourth conductive layer 42 and 52 as a voltage between the first starting voltage V1 and the second starting voltage V2.

As described above, a transistor according to example embodiments of the present embodiment may include the phase change layer as a channel. Accordingly, a transistor according to example embodiments of the present embodiment shown in FIG. 4 can be turned on or turned off by an operating voltage lower than 3V. Furthermore, the drain current (Id) may be suddenly raised when the transistor according to example embodiments of the present embodiment is switched from OFF state to ON state.

Because a transistor according example embodiments of the present embodiment may be operated by a lower operating voltage, the transistor may generate less heat. Also, a transistor according to example embodiments of the present invention may provide higher current with lower voltage because the drain current may be suddenly raised while switching.

In example embodiments, the phase change layer 44 may be formed using a vanadium oxide layer, a nickel oxide layer or a hafnium oxide layer but the phase change layer 44 may be formed of other material layers besides vanadium oxide layer, the nickel oxide layer or the hafnium oxide layer.

In an example embodiment, the phase change layer 44 may include a chalcogenide.

For example, the phase change layer 44 may include chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the phase change layer 44 may include an element in Group VA-antimony-tellurium such as tantalum-antimony-tellurium (Ta—Sb—Te), niobium-antimony-tellurium (Nb—Sb—Te) or vanadium-antimony-tellurium (V—Sb—Te) or an element in Group VA-antimony-selenium such as tantalum-antimony-selenium (Ta—Sb—Se), niobium-antimony-selenium (Nb—Sb—Se) or vanadium-antimony-selenium (V—Sb—Se). Further, the phase change layer 44 may include an element in Group VIA-antimony-tellurium such as tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium such as tungsten-antimony-selenium (W—Sb—Se), molybdenum-antimony-selenium (Mo—Sb—Se) or chrome-antimony-selenium (Cr—Sb—Se).

Although the phase change layer 44 is described above as being formed primarily of ternary phase-change chalcogenide alloys, the chalcogenide alloy of the phase change layer 44 could be selected from a binary phase-change chalcogenide alloy or a quaternary phase-change chalcogenide alloy. Example binary phase-change chalcogenide alloys may include one or more of Ga—Sb, In—Sb, In—Se, $Sb_2$—$Te_3$ or Ge—Te alloys; example quaternary phase-change chalcogenide alloys may include one or more of an Ag—In—Sb—Te, (Ge—Sn)—Sb—Te, Ge—Sb—(Se—Te) or $Te_{81}$—$Ge_5$—$Sb_2$—$S_2$ alloy, for example.

In an example embodiment, the phase change layer 44 may be made of a transition metal oxide having multiple resistance states, as described above. For example, the phase change layer 44 may be made of at least one material selected from the group consisting of NiO, $TiO_2$, HfO, $Nb_2O_5$, ZnO, $WO_3$, and CoO or GST ($Ge_2Sb_2Te_5$) or PCMO($Pr_xCa_{1-x}MnO_3$).

The phase change layer 44 may be formed to cover the first conductive layer 42 in example embodiments, but the phase change layer 44 may also be formed only on an upper surface of the first conductive layer 42. Furthermore, the resistor may be formed between the third conductive layer 50 which is a gate and the word line 60.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A transistor, comprising:
   a substrate;
   a first conductive layer on the substrate;
   a phase change layer and a second conductive layer sequentially stacked on the first conductive layer;
   a first current direction limiting unit and a second current direction limiting unit formed on the second conductive layer, wherein the first and second current direction limiting units are separated;
   a third conductive layer and a fourth conductive layer formed on the first current direction limiting unit and the second current direction limiting unit, respectively;
   a word line connected to the third conductive layer;
   a bit line connected to the fourth conductive layer; and
   a voltage lowering unit connected to the word line.

2. The transistor as claimed in claim 1, wherein the phase change layer is a material layer of which conductivity is varied according to an applied voltage.

3. The transistor as claimed in claim 2, wherein the material layer is one of a vanadium oxide layer, a nickel oxide layer and a hafnium oxide layer.

4. The transistor as claimed in claim 1, wherein the first and second current direction limiting units include a first PN conjunction layer and a second PN conjunction layer, respectively, preventing a current from backflowing from the phase change layer to the word line and the bit line, respectively, each of the first and second conjunction layers including an N-type material layer and a P-type material layer, which are sequentially stacked.

5. The transistor as claimed in claim 4, wherein the N-type material layer is one of a nickel oxide layer and a titanium oxide layer.

6. The transistor as claimed in claim 5, wherein the P-type material layer is a nickel oxide layer.

7. The transistor as claimed in claim 4, wherein the P-type material layer is a nickel oxide layer.

8. The transistor as claimed in claim 1, wherein the voltage lowering unit includes a resistor connected to one end of the word line.

9. The transistor as claimed in claim 1, wherein the phase change layer covers the first conductive layer.

10. A method of operating a transistor including a first conductive layer on a substrate, a phase change layer and a second conductive layer which are sequentially stacked on the first conductive layer, a first current direction limiting unit and a second current direction limiting unit formed on the second conductive layer and separated by a space, a third conductive layer and a fourth conductive layer formed on the first current direction limiting unit and the second current direction limiting unit, respectively, a word line connected to the third conductive layer, a bit line connected to the fourth conductive layer, and a voltage lowering unit connected to the word line, the method comprising:
    maintaining an electric potential difference between the bit line and the first conductive layer and applying an operating voltage to the word line.

11. The method as claimed in claim 10, wherein the first and second current direction limiting units are a first PN conjunction layer and a second PN conjunction layer, respectively.

12. The method as claimed in claim 11, wherein each of the first PN conjunction layer and the second PN conjunction layer includes a N-type material layer and a P-type material layer which are sequentially stacked, wherein the N-type material layer is one of a nickel oxide layer and a titanium oxide layer and the P-type material layer is a nickel oxide layer.

13. The method as claimed in claim 10, wherein the phase change layer is one of a nickel oxide layer, a vanadium oxide layer and a hafnium oxide layer.

14. The method as claimed in claim 10, wherein the operating voltage is lower than the electric potential difference.

* * * * *